(12) United States Patent
Hibbs et al.

(10) Patent No.: US 7,239,376 B2
(45) Date of Patent: Jul. 3, 2007

(54) METHOD AND APPARATUS FOR CORRECTING GRAVITATIONAL SAG IN PHOTOMASKS USED IN THE PRODUCTION OF ELECTRONIC DEVICES

(75) Inventors: Michael S. Hibbs, Westford, VT (US); Max G. Levy, Essex Junction, VT (US); Kenneth C. Racette, Fairfax, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/161,215

(22) Filed: Jul. 27, 2005

(65) Prior Publication Data

US 2007/0024831 A1    Feb. 1, 2007

(51) Int. Cl.
*G03B 27/62* (2006.01)
*G03B 27/42* (2006.01)

(52) U.S. Cl. ............................ 355/75; 355/53; 355/76

(58) Field of Classification Search ............... 355/53, 355/75, 76; 430/5
See application file for complete search history.

(56) References Cited

U.S. PATENT DOCUMENTS

| 6,069,931 | A | 5/2000 | Miyachi et al. |
| 6,459,474 | B1 | 10/2002 | Okada |
| 6,480,260 | B1 * | 11/2002 | Donders et al. ............... 355/53 |

* cited by examiner

*Primary Examiner*—Alan Mathews
(74) *Attorney, Agent, or Firm*—Francis J. Thornton

(57) ABSTRACT

In a projection apparatus for projecting optical images, an optical mask support stage having a pair of separated arms. Each arm being provided with a respective mask chucking bar that supports a respective edge of a thin glass mask and applies to the respective edge a bending moment away from the center of the mask to reduce or eliminate any gravitational induced sag in the center of the mask thereby improving the quality of the images projected by the apparatus.

7 Claims, 6 Drawing Sheets

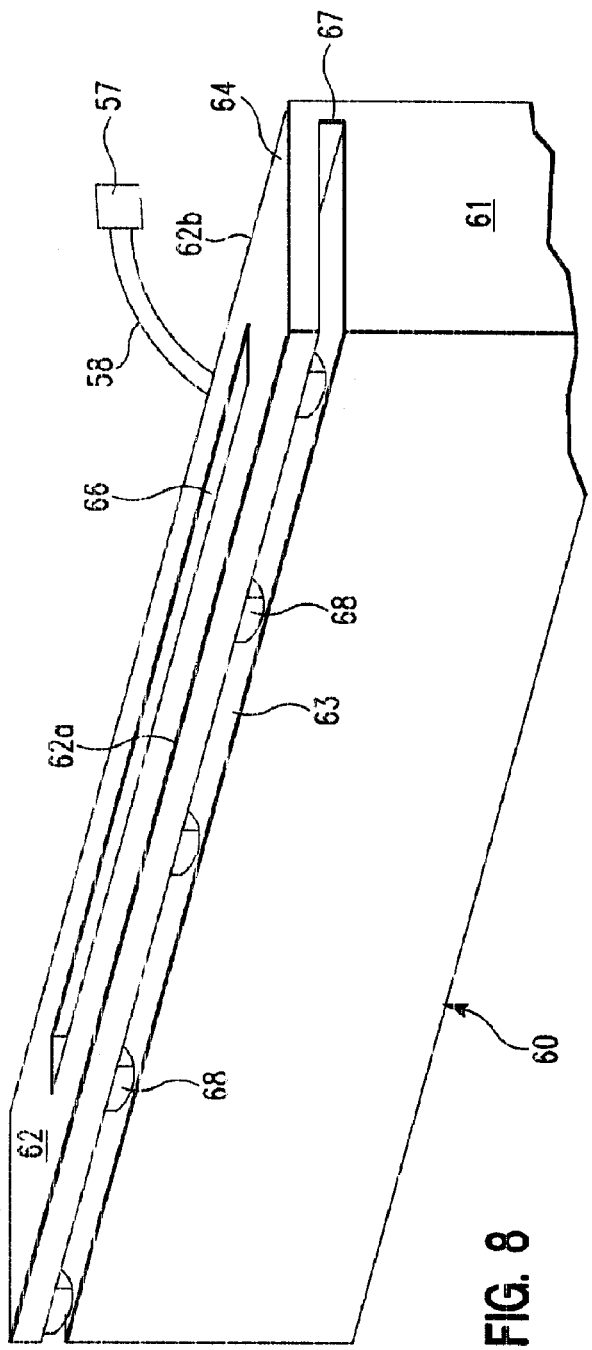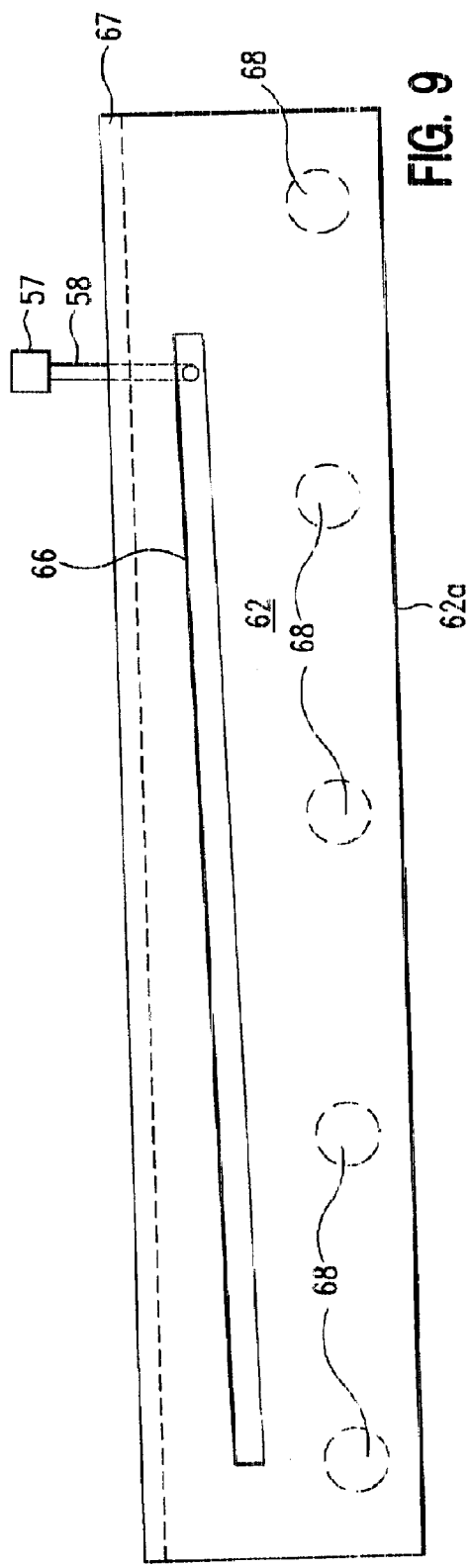

METHOD AND APPARATUS FOR CORRECTING GRAVITATIONAL SAG IN PHOTOMASKS USED IN THE PRODUCTION OF ELECTRONIC DEVICES

FIELD OF THE INVENTION

The present invention relates generally to optical lithography devices that utilize glass photo-masks bearing patterns or images which can be optically projected to define images in a photoresist layer on the surface of a semiconductor wafer body. These images are then developed and used to produce, in the wafer, a plurality of semiconductor devices, circuits or other such micro-devices more particularly, the present invention is directed to an improved optical lithography device having means therein for reducing or correcting gravitational created distortions, in such glass photo masks. Such correction is achieved by creating a unique mask support or holding assembly that will apply forces to the mask held on the mask support or holding assembly to substantially minimize, offset, or correct, in the mask, any such gravitational created distortion.

BACKGROUND OF THE INVENTION

Semiconductor device production lines presently utilize various types of commercially available photolithographic exposure apparatus to transfer images from a glass photo mask onto a photosensitive coated substrate via a projection optical system. At present, the typical photo masks used in such projection systems are usually in the form of a plate comprised of fused silica glass or quartz glass. These glass photo masks are positioned, in a projection system or apparatus, on a mask support or holding assembly usually comprised of a support frame, open in the center. The glass mask, is placed on the frame or support arms such that it is supported only by its edge regions so that the center portion of the mask is clear of any obstructions such that an optical beam can be passed there through so that the images on the mask can be reproduced in an photo-resist imaging layer deposited on the surface of a semiconductor wafer.

As semiconductor devices, became smaller, denser and more complex, the images on the masks became correspondingly smaller, denser, and more complex. To produce these smaller, denser devices the optics also improved to the point that the depth of focus required for the lithographic projection apparatus needed to produce such components has become so small that the flatness of the photo mask being used is no longer a negligible component. In an attempt to correct for this, mask blank suppliers have been making rapid advances in creating very flat photo mask blanks and have improved the flatness of the mask surfaces from 2.0 µm flatness to 0.5 µm flatness or better. However, the overall size of such masks is relatively large and, at present, such masks typically cover an area of 36 square inches or more. Such large photo masks thus must have a minimum thickness of between 6 or 7 mm to provide the mechanical strength necessary for their handling and to support themselves when placed on the spaced apart mask support arms. Thus even though the mask surfaces are now initially flatter and more uniform, the weight of large masks is such that when the mask is placed on separated mask supports, the unsupported center of the mask distorts, i.e. sags, due to gravity. The gravitational induced sag in the center of a 6.35 mm thick, six inch square mask supported at opposing edges is typically between 0.5 µm and 1.0 µm.

Any such sag in the center of the mask creates significant focusing errors in the projected image and some manufacturers, to correct for such focusing errors, have attempted to develop algorithms to optically correct for such focusing errors. One such technique attempts to do so by altering the focal point of the projection beam to compensate for the amount of sag in the surface of the mask However, to date, such wafer exposure programs and controls are not only very complex but in most cases only partially correct for the focus errors caused by gravitationally induced sagging.

Accordingly the present invention is designed to circumvent these difficulties and does so by providing a mask exposure apparatus that will mechanically apply forces to the mask that will cancel or substantially reduce the errors or distortions in the mask caused by gravitational forces.

SUMMARY OF THE INVENTION

The present invention is directed to a mask support arrangement comprised of a pair of separated stages or arms each of which supports a respective novel mask chucking bar. One of said bars is arranged to support and hold a first edge of a thin glass mask and the other of said bars is arranged to, support and hold the second and opposing edge of the mask such that the central portion of the mask spanning the separation between the bars is unsupported. Each bar is particularly designed to apply to the respective edge placed thereon a bending away from the center of the mask that will cause any gravitational induced sag in the unsupported center of the mask to be substantially reduced or eliminated. In this way the unsupported central portion of the mask is effectively flattened. With this reduction in the central sag of the mask the quality of the images reproduced in the photoresist layer on the surface of the wafer is also improved thus resulting in better devices being produced in the wafer.

In a first embodiment, a pair of separated stage arms, each of which is provided with a respective unique chucking bar having an upper tapered surface. The taper on the bar on the first stage being in opposition to the taper on the bar on the second stage such that when a mask is spanned there between, each bar will apply a respective bending force on the edge of the mask secured thereto such that any gravitationally induced sag in the portion of the mask between the chucking bars will be substantially reduced or eliminated.

In a second embodiment, each of the separated stage arms is provided with a chucking bar coupled to a respective drive means so that each bar can be separately rotated to apply, to the edges of the mask supported there between forces sufficient to effectively result in a flattening out of the gravitational sag in the center of the mask.

In a third embodiment, each chucking bar, used on the support arms, has a hinged and cantilevered upper surface and drive means that, when activated, will cause each hinged, cantilevered surface to apply to the mask, supported there between forces sufficient to effectively result in a flattening out of the gravitational sag in the center of the mask.

In a fourth embodiment, a sensing means, for determining the amount of sag in the center of the mask surface, is coupled to drive the adjustable chucking bars of either the second or third embodiment so as to selectively apply forces to the mask the mask, supported there between sufficient to effectively result in a flattening out of the gravitational sag in the center of the mask.

In a fifth embodiment, a plurality of sensing means are employed to determine the height of the mask surface at a plurality of positions. These sensing means measure and map the mask surface height to determine the focal plane flatness of the mask and the amount that the adjustable chucking bars, of either the second or third embodiment must be moved to achieve optimum mask focal plane flatness. It being understood that these sensing, measuring, analyzing and chucking bar adjusting steps can be repeated as many times as necessary until the desired flatness of the focal plane is achieved.

These objects, features and advantages of the present invention will be become further apparent to those skilled in the art from the following detailed description taken in conjunction with the accompanying drawings.

BRIEF DESCRIPTION OF THE DRAWINGS

FIG. 8 is a perspective view of a third embodiment of the present invention employing a chucking bar provided with an adjustable, hinged upper surface;

FIG. 9 is a top view of the chucking bar of FIG. 8;

DETAILED DESCRIPTION OF THE INVENTION

Referring now to FIGS. 1 through 11 the present invention will be described in detail.

Figure 1:
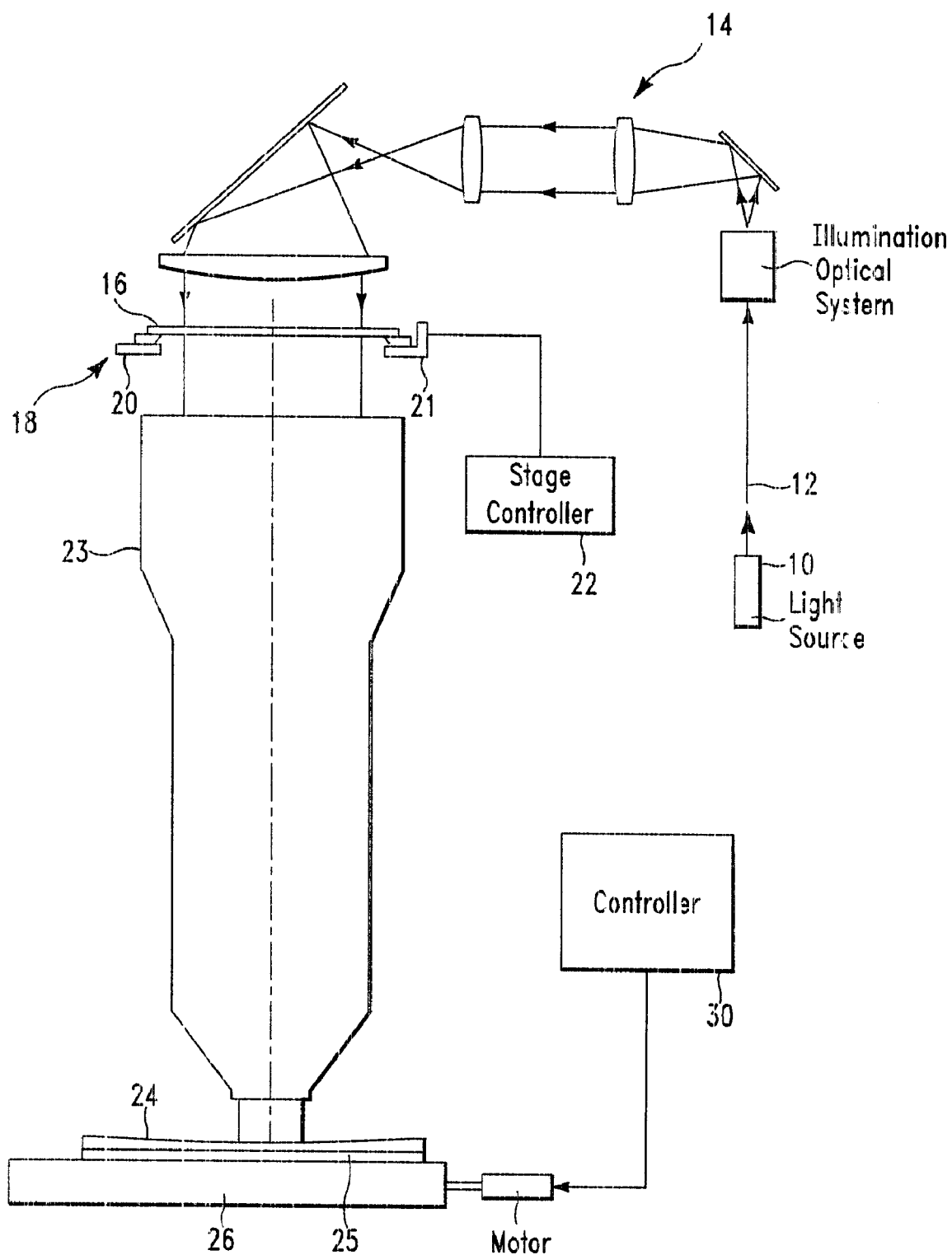
FIG. 1 is a schematic view of a typical prior art apparatus used to project a photo-mask onto a photo-resist coated semiconductor wafer.
Figure 2:
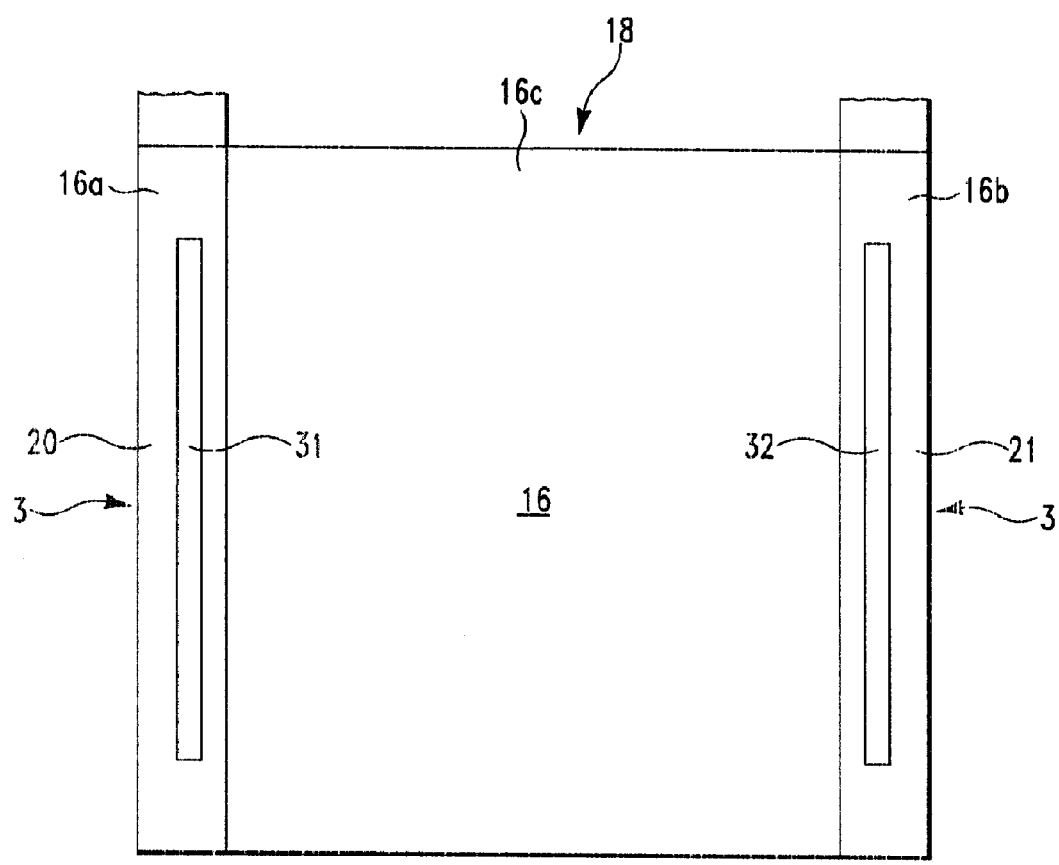
FIG. 2 is an enlarged top view of a typical photo-mask mounted on the support stage of the prior art apparatus shown in FIG. 1.
Figure 3:
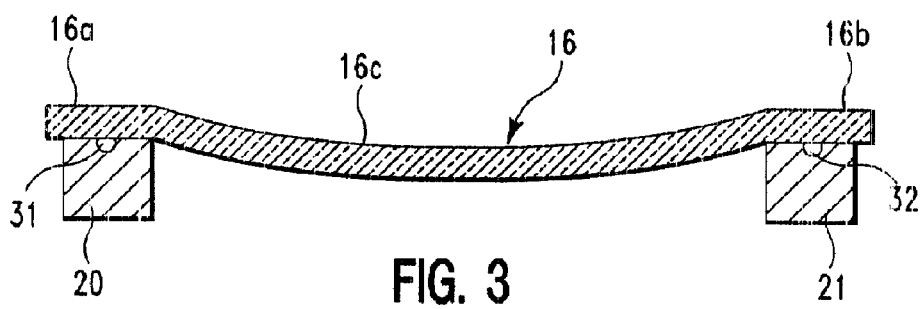
FIG. 3 is a sectional view of the prior art mask and support stage of FIG. 1, taken along the line 3-3 of FIG. 2, illustrating the gravitational sag occurring in the mask when it is supported in accordance with the prior art.
Figure 4:
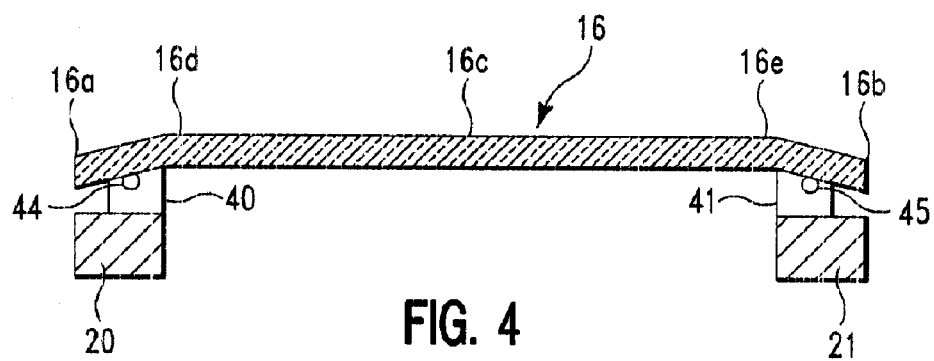
FIG. 4 is a side view of a mask mounted on a support stage that employs the fixed chucking bars of the first embodiment that apply fixed forces to the mask such that gravitational induced sag in the mask is reduced and/or substantially eliminated.
Figure 5:
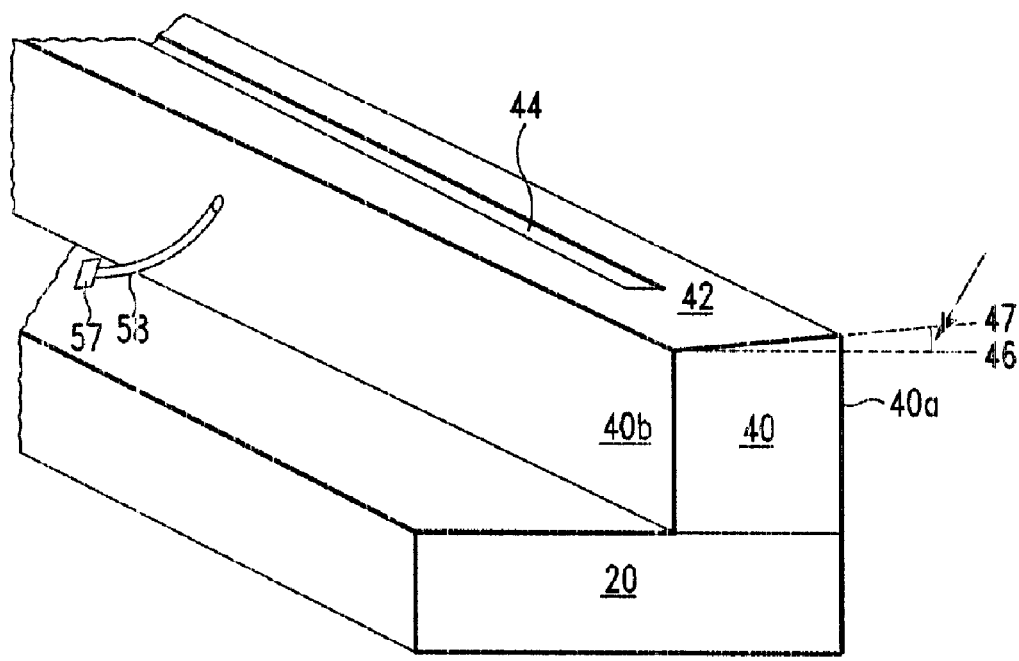
FIG. 5 is an enlarged, perspective view of the end of the left side of the support stage and left chucking bar designed in accordance with the fixed chucking bar of the first embodiment of the invention shown in FIG. 4.
Figure 6:
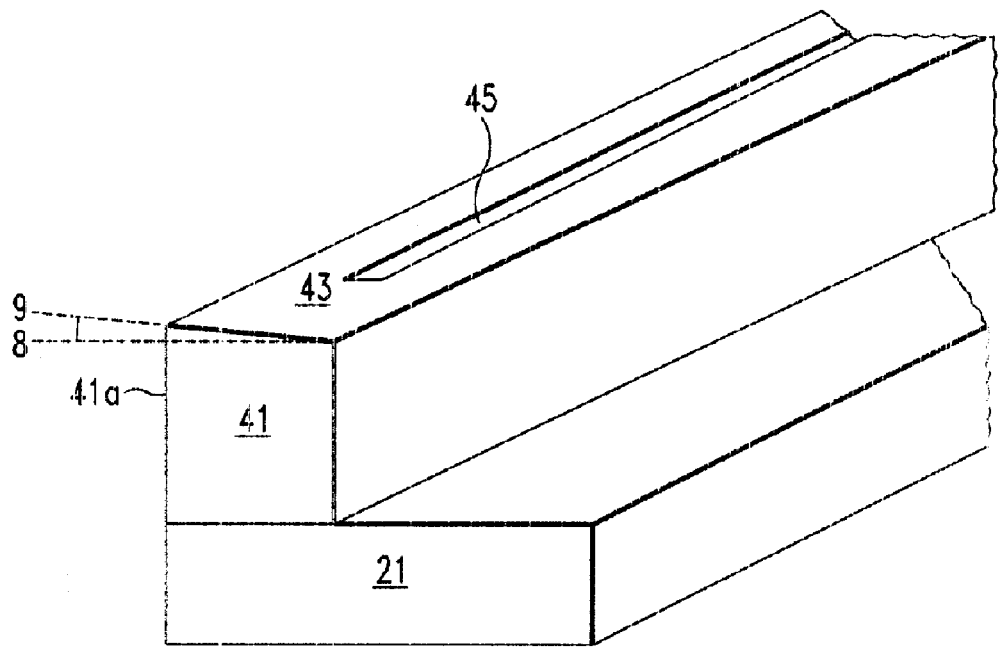
FIG. 6 an enlarged, perspective view of the end of the right side of the support stage and right chucking bar designed in accordance with the fixed chucking bar of the first embodiment of the invention shown in FIG. 4.
Figure 7:
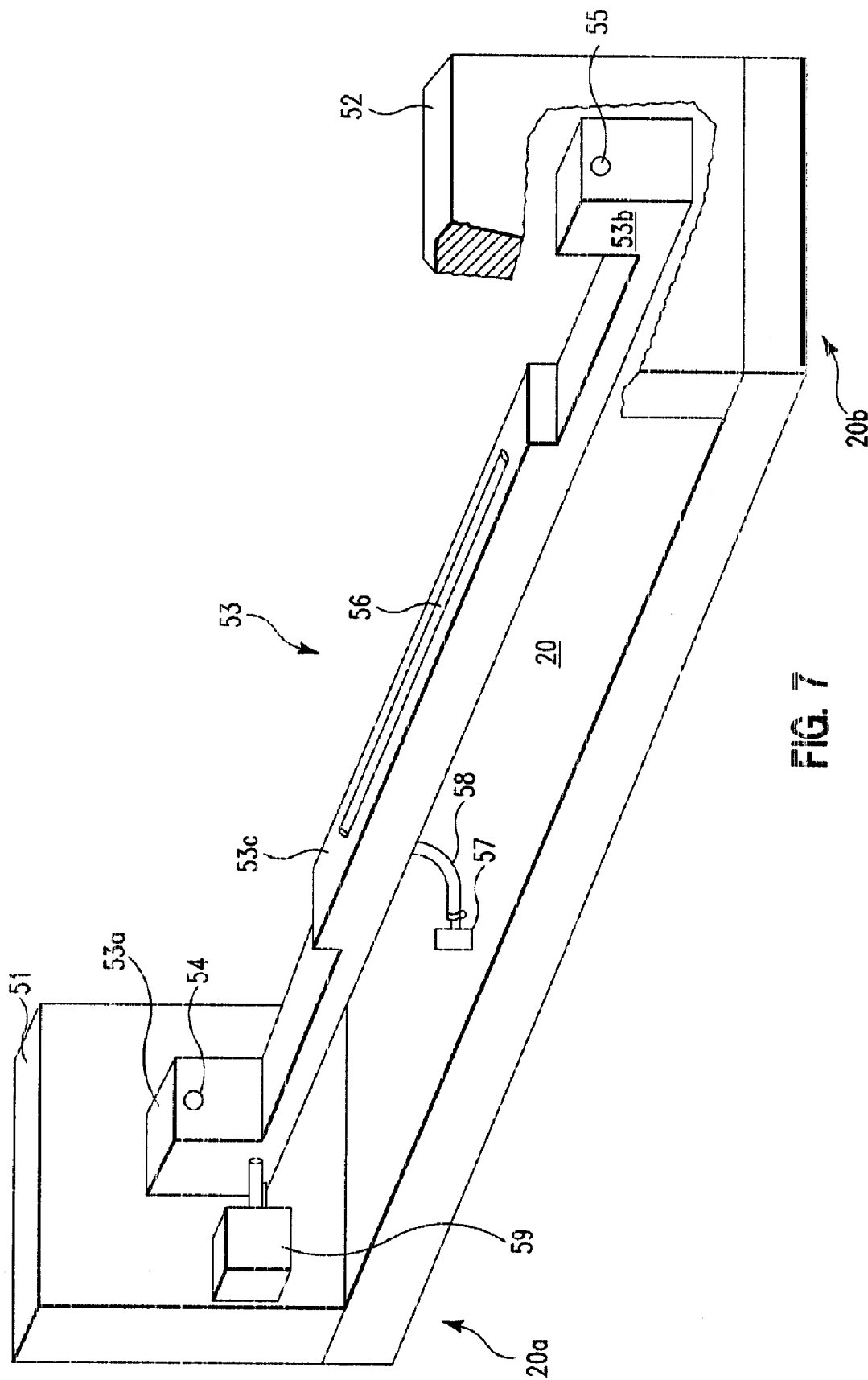
FIG. 7 is a perspective view of a second embodiment of the present invention that employs a rotary chucking bar on each the stage arm.
Figure 11:
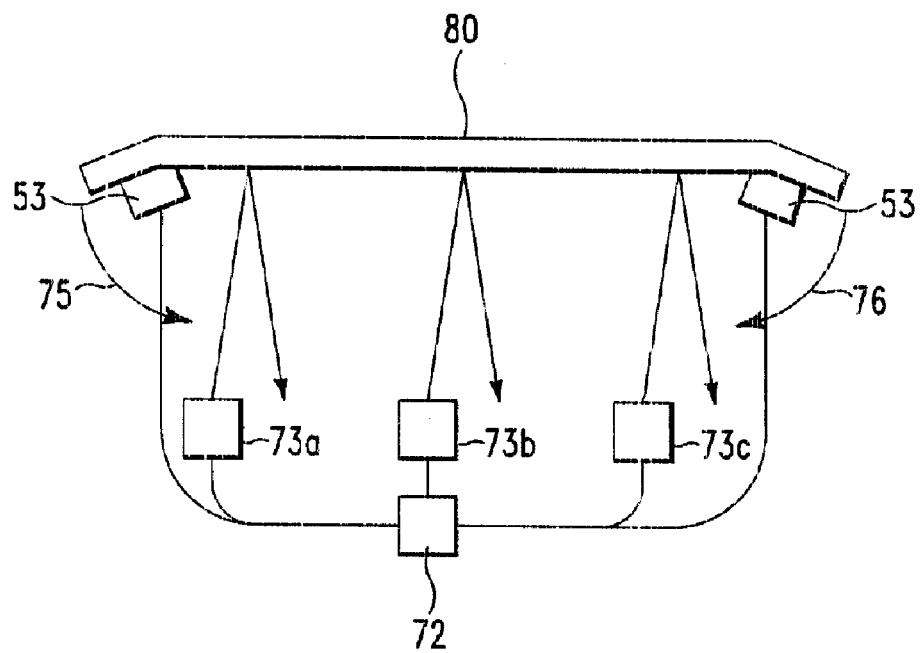
FIG. 11 is a side view of a mask provided with a plurality of position sensors for determining the amount of gravitational sag in the mask and for controlling the amount of force applied to the edges of the mask using either the chucking bar of the second embodiment or the chucking bar of the third embodiment to controllably reduce or substantially eliminate the sensed sag in the mask.
Figure 10:
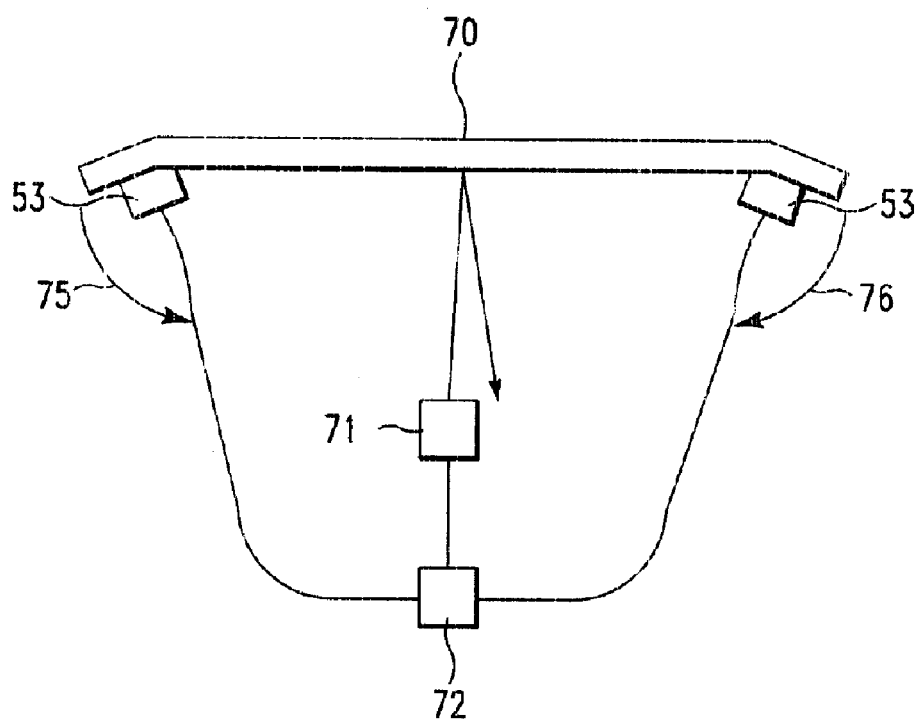
FIG. 10 is a side view of a mask having a central position sensor for determining the amount of gravitational sag in the mask and for controlling the amount of force applied to the edges of the mask using either the chucking bar of the second embodiment or the chucking bar of the third embodiment to controllably reduce or substantially eliminate the sensed sag in the mask.

FIG. 1 is a schematic view of a typical prior art apparatus used to project a photo-mask onto a photo-resist coated semiconductor wafer; FIG. 2 is an enlarged top view of a typical photo-mask mounted on the support stage of the prior art apparatus shown in FIG. 1; FIG. 3 is a sectional view of the prior art mask and support stage of FIG. 1, taken along the line 3-3 of FIG. 2, illustrating the gravitational sag occurring in the mask when it is supported in accordance with the prior art; FIG. 4 is a side view of a mask mounted on a support stage that employs the fixed chucking bars of the first embodiment that apply fixed forces to the mask such that gravitational induced sag in the mask is reduced and/or substantially eliminated; FIG. 5 is an enlarged, perspective view of the end of the left side of the support stage and left chucking bar designed in accordance with the fixed chucking bar of the first embodiment of the invention shown in FIG. 4; FIG. 6 an enlarged, perspective view of the end of the right side of the support stage and right chucking bar designed in accordance with the fixed chucking bar of the first embodiment of the invention shown in FIG. 4; FIG. 7 is a perspective view of a second embodiment of the present invention that employs a rotary chucking bar on each the stage arm; FIG. 8 is a perspective view of a third embodiment of the present invention employing a chucking bar provided with an adjustable, hinged upper surface; FIG. 9 is a top view of the chucking bar of FIG. 8; FIG. 10 is a side view of a mask having a central position sensor for determining the amount of gravitational sag in the mask and for controlling the amount of force applied to the edges of the mask using either the chucking bar of the second embodiment or the chucking bar of the third embodiment to controllably reduce or substantially eliminate the sensed sag in the mask; and FIG. 11 is a side view of a mask provided with a plurality of position sensors for determining the amount of gravitational sag in the mask and for controlling the amount of force applied to the edges of the mask using either the chucking bar of the second embodiment or the chucking bar of the third embodiment to controllably reduce or substantially eliminate the sensed sag in the mask.

FIG. 1 is a simplified schematic view of a typical mask projection exposure apparatus known to the prior art. Here, a light source 10, such as an excimer laser or the like, generates a light beam 12 that is directed along an optical path 14 to pass, in a perpendicular direction, through a photo mask 16, bearing a plurality of images thereon, that is positioned on a mask holding table or stage 18. The table or stage 18 typically comprises a pair of extended, spaced apart parallel support arms 20 and 21 that can be controlled in the both the vertical and horizontal planes by a stage controller 22, as is well known to the prior art. The beam 14 now projects the mask images through the projection system 23 which directs the images on to a specific portion of a photo-resist layer 24 deposited on a semiconductor wafer 25 that is mounted on an underlying wafer support table 26. By using a controller 30 to adjust the position of the wafer support table, the projected images can be placed in various and selected areas of the photoresist layer 24.

FIG. 2 is a top view of a typical photo-mask 16 spanning the separated support arms 20 and 21 as shown in FIG. 1. It is to be understood that such masks and their usage are well known to the semiconductor art and thus, for purposes of clarity, the images to be found in such masks are not shown here. In this FIG. 2, the mask 16 has a first edge region 16a positioned on the stage support arm 20 and its opposite edge region 16b positioned on the spaced apart stage support arm 21. Typically, mask edge 16a is secured to the surface of support arm 20 by a vacuum applied through ports in region 31 and the edge 16b is secured to the surface of support arm 21 by identical vacuum ports in region 32. In this way the central portion 16c of glass mask 16 is caused to span the width of the table or stage defined by the distance separating the support arms 20 and 21.

Present day glass photo masks 16 now are of six or more inches square, i.e., they have an area of thirty-six square inches or more. Preferably, such large masks, should be thin so as to provide the best optical conditions but to be handled, transported, and supported on the mask support stage while resisting gravitationally induced sag, must have a minimum thickness of 6 mm. Additionally, in order to permit the creation of large more complex devices, it is necessary that the central portion of such masks, where the images to be reproduced are contained be as large as possible. This requires that the distance between the stage arms be as large as possible to permit the span of the unsupported center 16c to be as large as possible. These factors combine to cause the span of mask center 16c to become greater and thus resulting in greater gravitational sag in the center of the mask being realized. Such increased sag results in greater focusing problems resulting in other difficulties such as poorer image reproduction that, in turn, affects the quality of the devices being produced and also limits the size and complexity of the devices that can be produced. Thus it is important that the center be as flat as possible.

FIG. 3 is a cross sectional view of a mask 16, taken along the lines 3-3 of FIG. 2, mounted on the prior art support stage arms 20 and 21 of FIG. 1 using the vacuum clamping regions 31 and 32, as taught by the prior art. This figure illustrates the sag in the center 16c of the mask 16 caused by the force of gravity when the mask 16 is so sited such that the opposing edge regions 16a, 16b are clamped on the separated stage arms 20 and 21. Typically, the center of such a six inch square mask, 6.35 mm thick mask will sag between 0.5 µm and 1.0 µm across the span of the central portion 16c. This amount of sag creates significant focusing errors and distortions in the projected images thus resulting in poorer quality devices being produced and in a higher device scrap rate. To reduce this scrap rate and improve the quality of the produced devices it is necessary to minimize, eliminate or compensate for this gravitational induced sag. The present invention achieves these ends by utilizing novel mask support means that applies forces to the supported mask that will substantially flatten the mask so as to effectively eliminate such gravitational sagging in the center of the mask.

Turning now to FIGS. 4, 5, and 6, a first embodiment of the present invention will be described. FIG. 4 is a cross-sectional view of a glass mask 16 having one edge 16a secured to the mask support arm 20 via a respective rigid, parallel, mask holding or chucking bar 40 and its opposite edge 16b secured to the mask support arm 21 via a respective rigid, parallel, mask holding or chucking bar 41. In accordance with the present invention, the chucking bars 40 and 41 are designed such that each will securely hold a respective mask edge 16a, 16b such the center 16c of the mask is supported there between. Each bar 40 and 41 has a top surface designed to securely hold down and apply a bending force on each respective edge 16a and 16b which forces are transmitted to the mask such that any gravitational induced sag in the mask center 16c is reduced, minimized, or substantially eliminated. The present invention achieves this result by providing the chucking bars 40 and 41, supporting the separated edges 16a and 16b, with slanted upper surfaces 42 and 43 respectively as shown in FIGS. 5 and 6 Each surface 42 and 43 is further provided with suitable means for clamping each respective edge 16a, 16b to each respective surface 42, 43. Vacuum means are particularly effective for clamping the mask edges 16a and 16b so securely that the mask edges 16a and 16b bend and conform to the slant of each upper surface 42, 43 and thereby transmit forces to the mask central region 16c such that will tend to flatten out and reducing the amount of sag in the mask center 16c. By so reducing the sag in the center of the mask the focusing errors induced by the sag are also lessened, minimized or effectively eliminated. The amount of force needed to flatten the mask need be just sufficient to counteract the gravitational bending force since the mask was manufactured to be flat before the gravitational sag occurred.

FIG. 5 is a perspective view of the end of the left support stage 20 carrying a left chucking bar 40 formed in accordance with a first embodiment of the invention and FIG. 6 is a perspective view of the end of the right support stage 21 carrying a right chucking bar 41 formed in accordance with a first embodiment of the invention. As shown, in FIGS. 5 and 6 each holding bar 40, 41 is fixedly attached to its respective underlying stage arm 20 and 21 by any convenient means such as soldering, welding screws, etc. The upper surface 42, 43 of each chucking or holding bar 40, 41 is slanted away from the center 16c of the mask. The angle away from the horizontal may vary from 5 microradians for a very rigid mounting material to 5 milliradians for a very soft rubber-like mounting material. In FIG. 5 this slope or slant is indicated by the dotted lines 46 and 47. The magnitude of the slope is shown greatly exaggerated for easier visibility. Thus, as shown in FIG. 5, the edge 40a of chucking bar 40 that is closest to the center 16c of mask 16 is higher than the bar's outer edge 40b. Each upper slanted surface 42, 43 is also provided with a respective vacuum channel 44, 45 that is coupled to a vacuum source 57 via a flexible line 58. However, it should now be obvious to one skilled in the art that the stage arm and the chucking bar could be a single unit.

As shown in FIG. 4, when each mask edge 16a and 16b is so placed in contact with a respective slanted upper surface 42, 43 and the vacuum is turned on, each edge 16a and 16b is caused to be pulled flat and forced to conform to the respective underlying slanted surface 42, 43. This clamping action introduces a bend in the glass and thus applies a torque, via the regions 16d and 16e that are immediately adjacent to the clamped edges 16a and 16b which pulls up the sagging center 16c of mask 16. As the sag in the center of the mask becomes reduced any focusing error in the projected images caused by such a sag is also reduced such that the quality of the images production in the photo-resist coating on the wafer positioned beneath the projector shown in FIG. 1 is improved. This improvement in the projected image results in improved device yield and lower production costs.

The vacuum clamping of the mask edges is not only especially effective for holding the mask edges 16a and 16c securely to the underlying slanted surface but also permits the mask to be cleanly and readily removed from the holding bars once the vacuum is released.

FIG. 7 is a perspective view of a second embodiment of the present invention wherein each stage arm is adapted to support a rotary chucking bar. In this embodiment each of the stage arms 20, 21, shown in FIG. 6, are identical and each has affixed, at each end, vertical chucking bar supports 51 and 52. Thus, as shown in this FIG. 7 a first vertical support 51 is affixed at a first end 20a of the stage arm 20 and a second vertical support 52 is affixed at the second or opposite end 20b of the arm 20. A chucking bar 53, that can be rotated, is now supported between the vertical supports 51 and 52 by pivot pins 54 and 55 that respectively extend from the vertical supports 51 and 52. These pivot pins 54 and 55 extend into the ends 53a and 53b of the chucking bar 53. The central portion 53c of chucking bar 53 is provided with a vacuum groove 56 that is coupled to a vacuum source 57 via a flexible line 58. Affixed to one of the vertical supports, e.g. vertical support 52 and coupled to the chucking bar 53 is any suitable drive element 59 that when activated will rotate the bar 53 about the supporting pivot pins 54 and 55.

Such a pair of rotary chucking bars are used as follows. A mask is suspended between such a pair of rotary chucking bars by placing a first edge 16a of the mask on one of the holding bars and the edge of the opposing side on the other holding bar. The vacuum source 57 is turned on, to clamp the over lying mask edge to the chucking bar. Once each opposing mask edge is securely clamped to a respective chucking bar, the drive element 59 on each bar is activated to rotate the bars in opposite directions so that the opposing clamped mask edges are turned down as shown in FIG. 4. Again, as described above, the clamped edges torque the regions of the mask immediately adjacent the clamped edges of the mask and the causes the center the mask clamped there between to be lifted thereby reducing any sag in the center of the mask. Again as discussed above any reduction of sag in the mask reduces or effectively eliminates any focusing error in the projected images caused by such sag that the reproduction of the images formed in the photoresist coating on the wafer positioned there under, as shown in FIG. 1, is improved. Again, the amount of rotational force needed to flatten the mask need be just sufficient to counteract the gravitational bending force since the mask was manufactured to be flat before the gravitational sag occurred.

FIG. 8 is perspective view of a third embodiment of the present invention and shows a stage arm 60 that can be substituted for either stage arm 20 or 21 shown in FIG. 2 and FIG. 9 is top planar view of the surface of the stage arm 60. The stage arm 60 is essentially comprised of a main body 61 which has a cantilevered plate 62 fixedly attached to and overlying its upper surface 63. This plate 62 has a free, i.e. cantilevered edge 62a and a fixed edge 62b and further has on its upper surface 64 a vacuum groove 66 that is coupled to a vacuum source 57 via a flexible line 58 by which a mask edge can be secured to the surface of the cantilevered plate 62. The fixed edge 62b of the cantilevered plate 62 is secured to underlying body 61 by a thin, flexible, support rib 67. The body 61 is provided with a plurality of drive devices 68 positioned beneath the plate 62 which can raise or lower the free cantilevered edge 62a as needed to bend or flex a respective mask edge secured thereon as taught above. These devices 68, can be, for example, mechanical, electric, magnetostrictive or piezoelectric devices or other such suitable drive devices and are provided in the body 62 near and beneath the free, cantilevered edge 62a of the plate 62 such that when they are activated, the free edge 62a of plate 62 will move upwards or downwards, causing the thin support rib 67 to flex. Because the arm 60 is asymmetrical it can be substituted for either Stage arm 20 or 21. In this way when the free edge 62a is raised or lowered forces will be applied to the mask to cause any sag in the center to be raised as taught above.

FIG. 10 is a side view of a mask 70 secured to movable chucking bars 53 such as those shown in FIG. 7. In this FIG. 10 there is shown a central position sensor 71, coupled to controller 72. The sensor is located beneath the mask and is designed to measure the amount of gravitational sag in the center of the mask 70 and feeding a signal to the controller 72 that send signals to drive 59, shown in FIG. 7, to rotate the movable chucking bars 53 such that they to apply a selected amount force, indicated by arrows 75 and 76 to the mask 70 supported thereon. As discussed above this rotation of the bars 53 will effectively flatten out of the gravitational sag in the center of the mask.

This positioning of the chucking bar is accomplished by first placing on the stage arms a very flat test mask containing a number of focus targets distributed across the usable surface of the mask. The sensor 71 which may be, for example, a laser position finder or other such means known to the art, of detecting the position of the mask surface, then measures the vertical position of the center of the mask. The image of the test mask is projected through the projection lens 23 of FIG. 1 and the focal error of each focal target is determined using methods known to the art. For example, the images may be used to expose a photoresist coated wafer through a plurality of focus positions and the best focus for each focus target determined by measurements of the optical quality of the developed images. Alternately the best focus for each focus target can be determined by an electronic image quality sensor in the imaging plane of the projection lens. The amount of sag at the center of the mask can be determined by comparing the best focal position of the focus targets near the center of the test mask to the best focal position of the focus positions of the focus targets near the edge of the patterned area of the mask. This information, i.e., the focus offset between the center and the edge of the mask is then sent to the controller 72 which in turn cause each of the drive mechanisms, e.g., driver 59 shown in FIG. 7 to rotate the bars 53 such that the opposing mask edges have applied thereto a calculated amount of torque that will flatten the sagging center of the mask. If necessary this procedure can be repeated as often as necessary until the focal plane of the mask is essentially flat. The amount of force needed to flatten the mask need be just sufficient to counteract the gravitational bending force since the mask was manufactured to be flat before the gravitational sag occurred. Also the magnitude of the force will not be large compared to the vacuum chucking forces. Once the optimum height of the center of the mask has been established, this position is used as the optimum height for any other mask used in the stepper. By measuring the vertical position of the center of the mask using sensor 71, and correcting the sag of the mask using a drive mechanism such as taught herein any mask can be corrected for gravitational sag.

FIG. 11 is a side view of a mask 70 positioned over a plurality of position sensors 73a, 73b, and 73c (again these may be laser position finders or other means of detecting the position of the mask surface) and the amount of gravitational sag in the mask. In this instance, a mask 80, to be flattened, is placed on the stage arms, carrying adjustable chucking bars as described above and shown in FIGS. 7, 8, and 9. In this embodiment, the three sensing means 73a, 73b, and 73c are used to simultaneously determine sag in the three different positions of the mask against which they are directed. This information is then used to cause the chucking bars holding the mask to move and thereby achieve the optimum mask focal plane flatness. In this case, the optimum mask focal plane flatness of the mask is achieved when the three detected surface positions become collinear for then the mask is approximately flat. The amount of force needed to flatten the mask need be just sufficient to counteract the gravitational bending force since the mask was manufactured to be fiat before the gravitational sag occurred. The magnitude of the force will not be large compared to the vacuum chucking forces.

It should be further understood that other alternate features and solutions will now become obvious to one skilled in the art after review of the present invention.

This completes the description of the preferred embodiment of the invention. Since changes may be made in the above construction without departing from the scope of the invention described herein, it is intended that all the matter contained in the above description or shown in the accompanying drawings shall be interpreted in as illustrative and not in a limiting sense. Thus other alternatives and modifications will now become apparent to those skilled in the art without departing from the spirit and scope of the invention as set forth in the following claims.

What is claimed is:

1. A projection system for creating images in a photoresist layer on a semiconductor wafer positioned beneath the projection system from a mask supported in the system on a mask support comprising:

first and second opposing and separated stages defining an open central region there between for supporting first and second opposing edge regions of a glass mask;

each of said stages carrying a respective rigid chucking bar having a bottom surface, an inner side surface, an outer side surface and an upper surface;

the first one of said bars supporting and holding on its upper surface the first edge region of a glass mask;

the second one of said bars supporting and holding on its upper surface the opposing second edge region of said mask, said second edge region being opposite to and separated. from said first edge region by a central region of said mask;

said central portion of the mask spanning the open central region between said stages and being subject to the force of gravity, each of said bars having an inner side closest to the center of the mask and an outer side closest to the edge of the mask, said inner side being higher than said outer side to create a slanted upper surface on each of said bars so that the direction of the slant on the upper surface of one bar is opposition to the slant on upper surface of the other bar; and the upper surface of each of said bars carrying means for holding a respective edge of said mask placed thereon, for applying a force for bending the respective edge held thereon away from the center of the mask sufficient to substantially reduce or eliminate any gravitational induced sag in the unsupported center of the mask.

2. A projection system for creating images in a photoresist layer on a semiconductor wafer positioned beneath the projection system from a mask supported in the system on a mask support comprising:

first and second opposing and separated stages defining an open central region there between for supporting first and second opposing edge regions of a glass mask;

each of said stages carrying a respective rigid chucking bar;

the first one of said bars supporting and holding on its upper surface the first edge region of a glass mask;

the second one of said bars supporting and holding on its upper surface the opposing second edge region of said mask, said second edge region being opposite to and separated, from said first edge region by the central region of said mask;

said central portion of the mask spanning the open central region between said stages and being subject to the force of gravity; and said first chucking bar is coupled to a respective drive means for rotating said first bar in a first direction and said second bar in a second direction opposite to the direction of rotation of said first bar to, said opposing edges of a mask, supported there between, forces sufficient to effectively result in a flattening out of any gravitational sag in the center of the mask between said separated arms.

3. The mask support of claim 2 wherein a sensing means, positioned for determining the amount of sag in the center of the mask surface, is coupled to drive the adjustable chucking bars of on said arms to control the rotation of said bars to control the force applied to the mask, supported there between, sufficient to reduce the determined sag in the center of the mask.

4. The mask support of claim 2 wherein a plurality of sensing means positioned below the mask are used to determine the focal plane flatness of the mask; and the amount that the adjustable chucking bars must be moved to achieve optimum flatness of the focal plane of the mask supported between said arms.

5. The mask support of claim 3 wherein a plurality of sensing means are positioned beneath the mask to determine the focal plane flatness of the mask and the amount that the adjustable chucking bars must be moved to achieve optimum flatness of the focal plane of the mask supported between said arms.

6. A projection system for creating images in a photoresist layer on a semiconductor wafer positioned beneath the projection system from a mask supported in the system on a mask support comprising:

first and second opposing and separated stages defining an open central region there between for supporting first and second opposing edge regions of a glass mask there between;

each of said stages carrying a respective rigid chucking bar having a bottom surface, an inner side surface, an outer side surface, an upper surface and a cantilevered surface hinged to and extending over said upper surface;

the cantilevered surface on said first one of said bars supporting and holding on its upper surface the first edge region of the glass mask for holding said first edge region of said mask thereon;

the cantilevered surface on said second one of said bars supporting and holding on its upper surface the second edge region of said mask, for holding said second edge region of said mask thereon;

said central portion of the mask spanning the open central region between said stages being subject to the force of gravity, each of said bars having drive means positioned betweens said its upper surface and its cantilevered surfaces that, when activated, will move each hinged, cantilevered surface to apply to the mask, supported there between forces, sufficient to effectively result in a flattening out any sag in the center of the mask created by the forces of gravity.

7. The mask support of claim 6 wherein a sensing means, positioned for determining the amount of sag in the center of the mask surface, is coupled to raise the free end of the cantilevered surface of each stage arm to control the force applied to the mask, supported there between, an amount sufficient to reduce the determined sag in the center of the mask.

* * * * *